(12) United States Patent
Blank et al.

(10) Patent No.: US 6,682,295 B2
(45) Date of Patent: Jan. 27, 2004

(54) FLATTED OBJECT PASSIVE ALIGNER

(75) Inventors: Richard M. Blank, Sunnyvale, CA (US); Christopher W. Burkhart, Los Gatos, CA (US)

(73) Assignee: Novellus Systems, Inc., San Jose, CA (US)

( * ) Notice: Subject to any disclaimer, the term of this patent is extended or adjusted under 35 U.S.C. 154(b) by 43 days.

(21) Appl. No.: 09/886,803

(22) Filed: Jun. 21, 2001

(65) Prior Publication Data

US 2002/0197144 A1 Dec. 26, 2002

(51) Int. Cl.[7] .............................................. B65G 47/24
(52) U.S. Cl. ........................ 414/757; 414/433; 414/781; 414/936
(58) Field of Search ................................ 414/757, 936, 414/433, 781; 198/394

(56) References Cited

U.S. PATENT DOCUMENTS

| | | | | |
|---|---|---|---|---|
| 4,887,904 A | * | 12/1989 | Nakazato et al. | 198/394 |
| 5,052,886 A | * | 10/1991 | Moroi | 198/394 |
| 5,484,252 A | * | 1/1996 | Mutoh | 414/757 |
| 5,669,752 A | * | 9/1997 | Moon | 198/394 |
| 6,126,382 A | * | 10/2000 | Scales et al. | 198/394 |
| 6,203,268 B1 | * | 3/2001 | Miyashita | 414/757 |

* cited by examiner

*Primary Examiner*—Janice L. Krizek
(74) *Attorney, Agent, or Firm*—Delio & Peterson

(57) ABSTRACT

A device for aligning a flatted object to a desired orientation. The flatted object has a substantially circular perimeter and a flatted chord portion and may be a silicon wafer or a cover for an electrostatic chuck. The device includes multiple conically shaped rollers that center and rotationally align the object, each roller having a bottom lip for supporting the object. Centering rollers are mounted so that they contact the circular perimeter of the object when it is in the desired orientation. Rotational alignment rollers are mounted so that they contact the flatted chord portion of the object when it is in the desired orientation. When placed on the alignment device, the flatted object passively moves to the desired orientation under the force of gravity.

21 Claims, 1 Drawing Sheet

FLATTED OBJECT PASSIVE ALIGNER

BACKGROUND OF THE INVENTION

1. Field of the Invention

The present invention relates to devices for centering and rotationally aligning a flatted object to a desired orientation.

2. Description of Related Art

Microelectronic devices are typically constructed on a wafer having a substantially circular perimeter. During each processing step, the wafer must be correctly aligned by centering the wafer and turning it to the desired rotational orientation. This allows each processing step to proceed in alignment with the work done on the wafer during previous processing steps. The centering is done with respect to the circular perimeter of the wafer, however, in order to detect the correct rotational orientation, the circular perimeter of the wafer must be marked.

One method of marking the circular perimeter of the wafer is with a flatted chord portion. The flatted chord defines a unique rotational orientation for each wafer that is used to consistently align the wafer each time it is moved. Typically, the wafer will be moved into a desired position by a transport mechanism. The wafer is usually aligned into a known starting orientation before the transport mechanism moves the wafer. This alignment is conventionally achieved with an active alignment device that centers and rotates each wafer to the starting orientation so that the transport mechanism can then move it into the final aligned position.

Once the wafer has been placed in a processing chamber with the desired orientation, the wafer is clamped, typically with an electrostatic chuck. To ensure that each wafer is correctly processed, it is critical that the electrostatic chuck remain clean and uncontaminated. During the processing of a wafer, the electrostatic chuck is covered and protected against contamination by the overlying wafer. However, when the interior of the processing chamber is being cleaned, there is no wafer present. To protect the electrostatic chuck during such cleaning, a protective electrostatic chuck (PEC) cover is placed on the chuck.

The PEC cover has the same shape as the wafer, and it too must be correctly aligned relative to the electrostatic chuck to ensure that the PEC cover completely protects the chuck during the cleaning operation. Like the wafers, the PEC cover is conventionally aligned with an active alignment device prior to being moved by the transport system into the processing chamber and onto the electrostatic chuck.

An active alignment device uses a motorized drive system to position the wafer with the desired predetermined angle and position. This predetermined angle and position ensures that the wafer is picked up with a known orientation by the transport mechanism, which will then be able to deposit it with the desired final orientation for processing. However, active alignment devices are expensive. Accordingly, there is a need for a low cost alignment device, preferably one that operates passively and is driven by the weight of the wafer or PEC cover under the influence of gravity.

Active alignment devices that use motors are also relatively large. Although the wafers can be pre-aligned before they are moved into a processing system, the PEC cover is often stored internally where there is limited space available. Although the transport mechanism can accurately position a pre-aligned wafer or PEC cover on the chuck, each time the object is picked up and set down there is some positioning error. This positioning error can build up to unacceptable levels for a PEC cover that is repeatedly handled if it is not aligned between uses.

Consequently, a large active alignment mechanism that is suitable for pre-aligning wafers before entering the processing system may not be suitable for a PEC cover stored internally that must be repeatedly handled and repositioned accurately. A small, inexpensive aligner for PEC covers is particularly desirable.

Bearing in mind the problems and deficiencies of the prior art, it is therefore an object of the present invention to provide an alignment device for aligning a flatted object to a desired orientation that is low cost, has a small size and preferably operates passively to bring the flatted object to a desired orientation under the influence of gravity.

Still other objects and advantages of the invention will in part be obvious and will in part be apparent from the specification.

SUMMARY OF THE INVENTION

The above and other objects, which will be apparent to those skilled in art, are achieved in the present invention, which is directed to an alignment device for aligning a flatted object to a desired orientation. The flatted object has a substantially circular perimeter and a flatted chord portion and the alignment device includes a base, first and second conically shaped centering rollers and at least one conically shaped rotational alignment roller.

Each conically shaped roller is rotationally mounted to the base on a vertical roller axis and includes a bottom and a top. The roller is oriented such that the bottom of the conical portion has a greater diameter than the top. The bottom of each roller has a circular perimeter and the bottom perimeters of all the rollers define the final location and desired orientation of the flatted object.

The first and second centering rollers are mounted to the base such that the circular perimeters of the bottoms of the first and second conical rollers are substantially tangential to the desired final location for the circular perimeter of the flatted object when the flatted object is in the desired position. Each rotational alignment roller is mounted to the base such that the circular perimeter of its bottom is substantially tangential to the flatted chord portion of the flatted object when the flatted object is in the desired rotational orientation.

In the most highly preferred embodiment of the invention, the alignment device includes two rotational alignment rollers. Each rotational alignment roller is mounted such that the circular perimeter of its bottom is substantially tangential to the flatted chord portion of the flatted object when the flatted object is in the desired orientation. The preferred location for the two rotational alignment rollers is at opposite ends of the flatted chord portion of the flatted object.

It is preferred that all the rollers turn freely so that the flatted object will automatically and passively align itself to the desired position and rotational orientation under the influence of gravity. However, one or more of the rollers may be motorized, if desired, with sensors employed to detect when the desired orientation has been achieved.

Each conically shaped roller also includes a bottom lip for supporting the flatted object. The bottom lip has a diameter greater than the diameter of the bottom of its corresponding roller.

The conical portion of each roller has a surface sufficiently smooth and a conical angle sufficiently steep that the flatted object will slide down the surface into substantially tangential contact with the bottom of the conically shaped roller. A conical angle of at least fifty and preferably about seventy degrees is preferred. A suitable and preferred material for the rollers is a ceramic, such as an aluminum oxide ceramic.

The first and second rotational alignment rollers define a midpoint therebetween. It is preferred that this midpoint and the first and second centering rollers be approximately equally spaced from each other around the perimeter of the flatted object.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
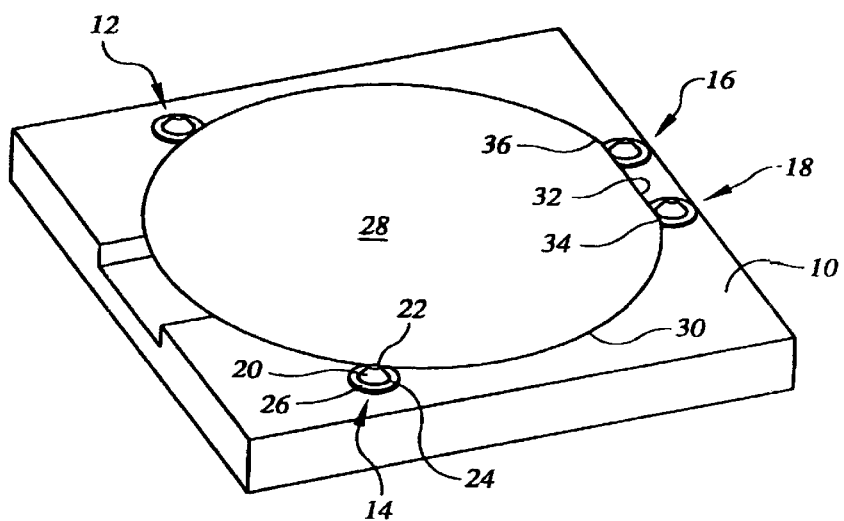
FIG. 1 is a perspective view of the present invention from the right front showing a flatted object in the aligned position.

Referring to FIG. 1, the present invention includes a horizontal base 10 and four conically shaped rollers 12, 14, 16 and 18. Each roller is substantially identical in shape and spins freely about a vertical axis, perpendicular to the plane of the base 10.

Each roller includes a conical portion 20 having a top 22 and a bottom 24. The bottom of the conical portion defines a circular perimeter and outside that perimeter is an outwardly extending bottom lip 26. The bottom lip has a larger diameter than the diameter of the bottom 24 of the cone 20 such that the lip extends underneath the flatted object 28 and supports it when the flatted object is in the desired orientation, as shown in FIG. 1.

The flatted object 28, which may be a wafer or a PEC cover, includes a substantially circular perimeter 30 and a flatted chord portion 32. The flatted chord defines a unique rotational orientation for the object 28.

Although the bottom lip 26 may extend horizontally outward, to reduce friction, it is preferred for the object to have only edge contact with each roller. Consequently, the bottom lip 26 is provided with a slight downward angle. An angle of between zero and twenty degrees is suitable, however, a downward angle of about five degrees is preferred.

Each roller is mounted to the base 10 such that the circular perimeter of the bottom 24 is in substantially tangential contact with the outer perimeter of the flatted object 28 when the flatted object is in the desired orientation. Specifically, rollers 12 and 14 are mounted to the base such that their bottoms are approximately tangential to the desired location for the circular perimeter 30.

Rollers 16 and 18 are mounted to the base such that their bottoms are substantially tangential to the desired location for the flatted chord portion 32. The bottom lips 26 of each roller will then extend underneath the flatted object. The object will be supported with its edge in tangential contact with each roller near to or at the transition point between the circular perimeter of the bottom 24 and the surrounding bottom lip 26.

Conical rollers 12 and 14 are "centering rollers" as they act to center the flatted object 28 relative to the desired aligned position. Conical rollers 16 and 18 are "rotational alignment rollers" as they act to turn the object 28 to the desired rotational orientation.

When a transport mechanism places the slotted object 28 onto the alignment device, any variation from the desired orientation illustrated in FIG. 1 will cause the flatted object 28 to be partially supported on the conical surface 20 of at least one of the four illustrated conical rollers. The conical surface 20 of each roller is smooth and the conical angle of that surface is sufficiently steep that the flatted object will slide down the smooth conical surface of the roller. This sliding action will continue until the perimeter 30, 32 of the object reaches substantially tangential contact with the bottom 24 of the roller and is supported by the bottom lip 26.

The conical angle (measured relative to a horizontally radial line from the bottom 24 to the center of the roller) is preferably at least fifty degrees and, most preferably, about seventy degrees. Other angles may be effective, depending on such factors as the weight of the object and the friction between the roller and the object.

The term "substantially tangential" is used herein to indicate that the rollers may be set to provide an interference fit with the object. An interference fit will cause the object to be supported on one or more of the conical surfaces of the rollers. This partial support will not introduce any significant error into the horizontal position of the center or rotational orientation. The transport mechanism is not sensitive to small vertical errors in position and the object will be picked up correctly by the transport mechanism.

The term "substantially tangential" is also used herein with respect to the relationship between the rollers and the object to indicate that the flatted object may be provided with an edge bevel or other edge shape. The edge shape may vary the exact perimeter location of the object slightly and/or cause the object perimeter to be aligned somewhat differently than exactly tangential to each roller.

A preferred material for constructing rollers having the desired smooth conical surface is a ceramic, such as an aluminum oxide ceramic. Aluminum oxide ceramic has a smooth, low friction, surface that is also quite hard. The hard surface limits the production of any contaminating particles. However, in the event that the ceramic surface produces any wear particles, the properties of the aluminum oxide ceramic material are such that the particles would present a relatively low contamination risk for normal silicon processing operations.

Provided that the circular perimeter of the flatted object 28 is in contact with the bases of both rollers 12 and 14, the center of the flatted object 28 will be in the desired location. The preferred position for centering rollers 12 and 14 is approximately 120 degrees from each other and approximately 120 degrees from the midpoint of the flatted chord portion 32, however this may be varied. The centering rollers should be spaced more than 10 degrees and less than 180 degrees from each other and at least 90 degrees from the midpoint between the rotational alignment rollers 16, 18.

Rotational alignment rollers 16 and 18 ensure that the object will rotate so that the flatted portion 32 is in the desired rotational orientation relative to the base 10. If the flatted object 28 is centered but is not in the correct rotational orientation, the straight perimeter edge 32 of the flatted chord portion will be in contact with the conical surface of roller 16 or roller 18. This contact will prevent the flatted object 28 from lying flat on the supporting bottom lips. Because the conical rollers rotate very freely, the object will rotate from this tilted position and will automatically turn to the desired rotational orientation under the influence of gravity. Accordingly any rotational misalignment will be automatically corrected and the object will automatically slide and turn until it reaches the desired flat and horizontal position illustrated in FIG. 1.

Although it is preferred that two rotational alignment rollers be used, the invention may also be made operable by using a single rotational alignment roller positioned at the midpoint of the flatted chord portion 32. This design, however, would provide significantly less rotational alignment force and is less desirable where accurate rotational alignment is desired.

The described passive operation with freely turning rollers that operate solely under the influence of gravity is most highly preferred due to its simplicity and low cost. Nonetheless, the design may also be implemented by motorizing one or more rollers and determining the correct alignment with optical, mechanical or electrical sensors.

The location of the rollers and the location of the circular perimeters of their bases 24 define the desired final orientation of the object 28. The location of the circular perimeters of their tops 22 define a target zone, within which the object is positioned when the object is set onto the aligner of this invention. In a typical application, a PEC cover is stored on an aligner of the type shown inside a transfer chamber just outside a processing chamber.

A transport mechanism will pick up the PEC cover and transfer it to the processing chamber during a cleaning cycle to protect the electrostatic chuck located therein. When the cleaning cycle is finished, the transport mechanism will pick up the PEC cover and return it to the aligner of this invention. The transport mechanism will deposit the PEC cover such that its circular perimeter is within the target zone defined by a circle tangential to the tops of the rollers. The size and shape of the conical rollers may be adjusted to control the size of the target zone.

The lips 26 on the rollers are made larger than the positioning error of the transport mechanism to ensure that each edge of the object 28 will always be supported when the object is first set on the aligner.

In addition to positioning error, the transport mechanism will also have some rotational alignment error. This error is generally small and the PEC cover will normally be set onto the aligner with a rotational orientation that is close to the desired orientation. Rotational alignment will automatically occur provided that the corner points 34 and 36 at the end of the chord 32 are initially placed outside the lines connecting the center of the rotational alignment rollers 16, 18 with the center of the object.

The farther the rotational alignment rollers 16, 18 are separated, the greater the rotational alignment force, but the less the range of rotational alignment errors that can be corrected. The desired optimum can be selected depending on the expected maximum error that the aligner will have to correct. The illustrated device uses rollers having a base diameter of 0.30 inches (7.6 mm), a maximum lip diameter of 0.625 inches (15.9 mm) and is intended to correct a centering position error of up to 0.60 inches (15.2 mm) and a rotational error of +/-3 degrees.

The use of the aligner as a holder for a PEC cover between uses ensures that errors in positioning do not build up. Although the aligner works particularly well for a PEC cover, it may also be used to align other flatted objects, including flatted silicon wafers.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. An alignment device for aligning a flatted object to a desired planar and angular orientation, the flatted object having a substantially circular perimeter and a flatted chord portion, the alignment device comprising:

a base;

a first conically shaped centering roller, for contacting the circular perimeter of the flatted object, rotationally mounted to the base on a vertical roller axis, the first centering roller including a bottom and a top, the bottom having a circular perimeter with a diameter greater than the top; a second conically shaped centering roller, for contacting the circular perimeter of the flatted object, rotationally mounted to the base on a vertical roller axis, the second centering roller including a bottom and a top, the bottom having a circular perimeter with a diameter greater than the top, the first and second centering rollers being mounted at fixed locations on the base such that the circular perimeters of the bottoms of the first and second conical rollers are substantially tangential to a desired location for the circular perimeter of the flatted object when the flatted object is in the desired planar and angular orientation; and at least one conically shaped rotational alignment roller, for contacting the flatted chord portion of the flatted object, rotationally mounted to the base on a vertical roller axis, the at least one rotational alignment roller including a bottom and a top, the bottom having a circular perimeter with a diameter greater than the top, the at least one rotational alignment roller being mounted at a fixed location such that the circular perimeter of the bottom of the at least one rotational alignment roller is substantially tangential to the flatted chord portion of the flatted object when the flatted object is in the desired planar and angular orientation and the flatted object is in the desired planar orientation only when the flatted object is also in the desired angular orientation.

2. The alignment device for aligning a flatted object to a desired orientation according to claim 1 wherein all of the conically shaped rollers are free turning whereby the flatted object automatically aligns to the desired orientation under the influence of gravity.

3. The alignment device for aligning a flatted object to a desired orientation according to claim 1 wherein each conically shaped roller includes a bottom lip for supporting the flatted object, the bottom lip having a diameter greater than the diameter of the bottom of its corresponding roller.

4. The alignment device for aligning a flatted object to a desired orientation according to claim 1 wherein each conically shaped roller is constructed of ceramic.

5. The alignment device for aligning a flatted object to a desired orientation according to claim 1 wherein each conically shaped roller has a surface sufficiently smooth and a conical angle sufficiently steep to permit the flatted object to slide down the surface into substantially tangential contact with the bottom of the conically shaped roller.

6. The alignment device for aligning a flatted object to a desired orientation according to claim 5 wherein the conical angle of each conically shaped roller is at least fifty degrees.

7. The alignment device for aligning a flatted object to a desired orientation according to claim 6 wherein the conical angle of each conically shaped roller is approximately seventy degrees.

8. The alignment device for aligning a flatted object to a desired orientation according to claim 1 further including a second conically shaped rotational alignment roller rotationally mounted to the base on a vertical roller axis, the second rotational alignment roller including a bottom and a top, the bottom having a circular perimeter with a diameter greater than the top, the second rotational alignment roller being mounted such that the circular perimeter of the bottom of the second rotational alignment roller is also substantially tangential to the flatted chord portion of the flatted object when the flatted object is in the desired orientation.

9. The alignment device for aligning a flatted object to a desired orientation according to claim 8 wherein all of the conically shaped rollers are free turning and support the flatted object whereby the flatted object automatically aligns to the desired planar and angular orientation under the influence of gravity.

10. The alignment device for aligning a flatted object to a desired orientation according to claim 8 wherein each conically shaped roller includes a bottom lip for supporting the flatted object, the bottom lip having a diameter greater than the diameter of the bottom of its corresponding roller.

11. The alignment device for aligning a flatted object to a desired orientation according to claim 8 wherein each conically shaped roller is constructed of ceramic.

12. The alignment device for aligning a flatted object to a desired orientation according to claim 11 wherein each conically shaped roller is constructed of aluminum oxide ceramic.

13. An alignment device for aligning a flatted object to a desired planar and angular orientation, the flatted object having a substantially circular perimeter and a flatted chord portion, the alignment device comprising:
   a base;
   a first conically shaped centering roller, for contacting the circular perimeter of the flatted object, rotationally mounted to the base on a vertical roller axis, the first centering roller including a bottom and a top, the bottom having a circular perimeter with a diameter greater than the top;
   a second conically shaped centering roller, for contacting the circular perimeter of the flatted object, rotationally mounted to the base on a vertical roller axis, the second centering roller including a bottom and a top, the bottom having a circular perimeter with a diameter greater than the top, the first and second centering rollers being mounted at fixed locations on the base such that the circular perimeters of the bottoms of the first and second centering rollers are substantially tangential to a desired location for the circular perimeter of the flatted object when the flatted object is in the desired planar and angular orientation;
   a first conically shaped rotational alignment roller, for contacting the flatted chord portion of the flatted object, rotationally mounted to the base on a vertical roller axis, the first rotational alignment roller including a bottom and a top, the bottom having a circular perimeter with a diameter greater than the top; and
   a second conically shaped rotational alignment roller, for contacting the flatted chord portion of the flatted object, rotationally mounted to the base on a vertical roller axis, the second rotational alignment roller including a bottom and a top, the bottom having a circular perimeter with a diameter greater than the top, the first and second rotational alignment rollers being mounted at fixed locations on the base such that the circular perimeters of the bottoms of the first and second rotational alignment rollers are both substantially tangential to the flatted chord portion of the flatted object when the flatted object is in the desired planar and angular orientation and the flatted object is in the desired planar orientation only when the flatted object is also in the desired angular orientation.

14. The alignment device for aligning a flatted object to a desired orientation according to claim 13 wherein the first and second centering rollers are located on an opposite side of the base from the first and second rotational alignment rollers.

15. The alignment device for aligning a flatted object to a desired orientation according to claim 13 wherein the first and second rotational alignment rollers are located at opposite ends of the flatted chord portion of the flatted object when the flatted object is in the desired orientation.

16. The alignment device for aligning a flatted object to a desired orientation according to claim 13 wherein the first and second rotational alignment rollers define a midpoint therebetween and the first centering roller, the second centering roller and the midpoint are approximately equally spaced from each other around the substantially circular perimeter of the flatted object when the flatted object is in the desired orientation.

17. The alignment device for aligning a flatted object to a desired orientation according to claim 13 wherein all of the conically shaped rollers are free turning whereby the flatted object automatically aligns to the desired orientation under the influence of gravity.

18. The alignment device for aligning a flatted object to a desired orientation according to claim 13 wherein each conically shaped roller includes a bottom lip for supporting the flatted object, the bottom lip having a diameter greater than the diameter of the bottom of its corresponding roller.

19. The alignment device for aligning a flatted object to a desired orientation according to claim 13 wherein each conically shaped roller is constructed of ceramic.

20. The alignment device for aligning a flatted object to a desired orientation according to claim 13 wherein each conically shaped roller has a surface sufficiently smooth and a conical angle sufficiently steep to permit the flatted object to slide down the surface into substantially tangential contact with the bottom of the conically shaped roller.

21. The alignment device for aligning a flatted object to a desired orientation according to claim 20 wherein the conical angle of each conically shaped roller is approximately seventy degrees.

* * * * *

UNITED STATES PATENT AND TRADEMARK OFFICE
CERTIFICATE OF CORRECTION

PATENT NO. : 6,682,295 B2  Page 1 of 1
DATED : January 27, 2004
INVENTOR(S) : Richard M. Blank and Christopher W. Burkhart It is certified that error appears in the above-identified patent and that said Letters Patent is hereby corrected as shown below:

<u>Column 5,</u>
Line 22, delete "bases" and substitute therefore -- bottoms --.

Signed and Sealed this

Sixteenth Day of March, 2004

JON W. DUDAS
*Acting Director of the United States Patent and Trademark Office*